(12) United States Patent
Lee

(10) Patent No.: US 9,147,445 B2
(45) Date of Patent: Sep. 29, 2015

(54) SEMICONDUCTOR DEVICE INCLUDING A CHARGE CONTROLLER, A DELAY UNIT AND A DISCHARGER

(71) Applicant: SK hynix Inc., Icheon-si Gyeonggi-do (KR)

(72) Inventor: Hyun Chul Lee, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 38 days.

(21) Appl. No.: 14/193,157

(22) Filed: Feb. 28, 2014

(65) Prior Publication Data

US 2015/0092504 A1    Apr. 2, 2015

(30) Foreign Application Priority Data

Sep. 30, 2013   (KR) .......................... 10-2013-0116210

(51) Int. Cl.
*G11C 7/00* (2006.01)
*G11C 5/14* (2006.01)
*G11C 7/22* (2006.01)

(52) U.S. Cl.
CPC . *G11C 5/148* (2013.01); *G11C 7/22* (2013.01)

(58) Field of Classification Search
CPC .................................. G11C 5/148; G11C 7/22

USPC .................. 365/76, 183, 185.25, 194, 189.05
See application file for complete search history.

(56) References Cited

U.S. PATENT DOCUMENTS

| 2002/0027464 A1 | 3/2002 | Lee et al. | |
| 2010/0329064 A1* | 12/2010 | Wilson | 365/229 |
| 2012/0224445 A1* | 9/2012 | Hauck | 365/229 |

FOREIGN PATENT DOCUMENTS

KR    1020020090834 A    12/2002

* cited by examiner

*Primary Examiner* — Tha-O H Bui
(74) *Attorney, Agent, or Firm* — William Park & Associates Ltd.

(57) ABSTRACT

Semiconductor devices are provided. The semiconductor device includes a charge controller, a delay unit and a discharger. The charge controller controls an amount of electric charges on a first node to output a drive signal through the first node. The delay unit includes a capacitor coupled to the first node and retards the drive signal to generate an output signal. A delay time of the drive signal is controlled according to an amount of electric charges of the first node. The discharger discharges the electric charges of the first node when the amount of electric charges of the first node is equal to a predetermined value.

19 Claims, 4 Drawing Sheets

SEMICONDUCTOR DEVICE INCLUDING A CHARGE CONTROLLER, A DELAY UNIT AND A DISCHARGER

CROSS-REFERENCE TO RELATED APPLICATION

The present application claims priority under 35 U.S.C. 119(a) to Korean Application No. 10-2013-0116210, filed on Sep. 30, 2013, in the Korean Intellectual Property Office, which is incorporated herein by reference in its entirety as set forth in full.

BACKGROUND

1. Technical Field

Embodiments of the present disclosure relate to semiconductor devices.

2. Related Art

In general, a semiconductor device may be designed to include an active mode and a standby mode. In the active mode, the semiconductor device may receive a command signal to execute a read operation for outputting data stored therein or a write operation for inputting external data. In the standby mode, the semiconductor device may maintain an idle state without execution of the read operation and the write operation.

In the active mode, the semiconductor device may receive a read command signal or a write command signal to activate a word line selected by an address signal for outputting internal data or for inputting external data. In the standby mode, the semiconductor device may maintain an idle state with minimum power consumption.

Meanwhile, the semiconductor device may operate in the standby mode after the active mode. In such a case, the standby mode may start after a certain time elapses from a moment that the active mode terminates. That is, the semiconductor device may be designed such that an internal signal generated in response to the command signal is delayed by a predetermined time and the standby mode starts at a moment that the delayed internal signal is generated. Thus, the semiconductor device may be designed to include a delay circuit that retards the command signal to generate the internal signal.

SUMMARY

Various embodiments are directed to semiconductor devices.

According to various embodiments, a semiconductor device includes a charge controller, a delay unit and a discharger. The charge controller is suitable for controlling an amount of electric charges on a first node to output a drive signal through the first node. The delay unit is configured to include a capacitor coupled to the first node and is suitable for retarding the drive signal to generate an output signal. A delay time of the drive signal is controlled according to an amount of electric charges of the first node. The discharger is suitable for discharging the electric charges of the first node when the amount of electric charges of the first node is equal to a predetermined value.

According to various embodiments, a semiconductor device includes a charge controller, a delay unit, a control signal generator and a discharger. The charge controller is suitable for controlling an amount of electric charges on a first node to output a drive signal through the first node. The delay unit is configured to include a capacitor coupled to the first node and is suitable for retarding the drive signal to generate an output signal. A delay time of the drive signal is controlled according to an amount of electric charges of the first node. The control signal generator is suitable for generating a control signal enabled when the amount of electric charges of the first node is equal to a predetermined value. The discharger is suitable for discharging the electric charges of the first node in response to the control signal.

BRIEF DESCRIPTION OF THE DRAWINGS

Embodiments of the present invention will become more apparent in view of the attached drawings and accompanying detailed description, in which.

DETAILED DESCRIPTION

Various embodiments of the present invention will be described hereinafter with reference to the accompanying drawings. However, the embodiments described herein are for illustrative purposes only and are not intended to limit the scope of the present invention.

Figure 1:
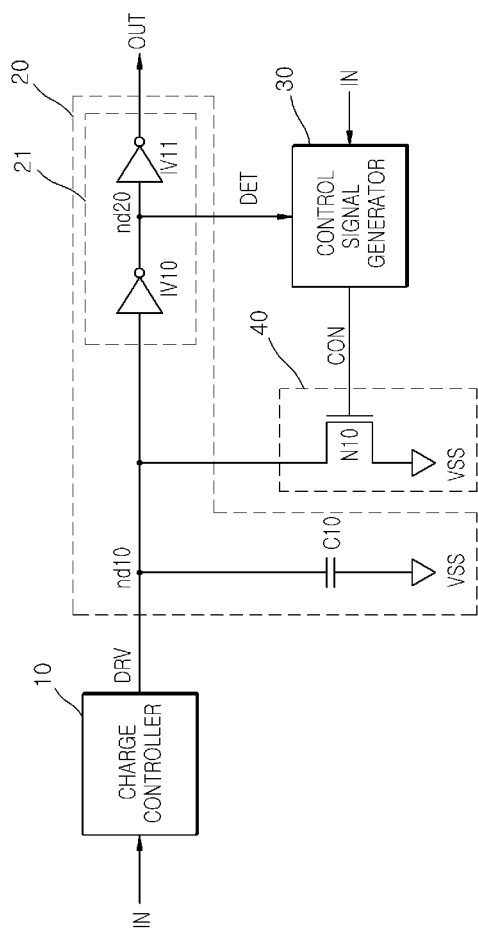
FIG. 1 is a schematic view illustrating a semiconductor device according to an embodiment of the present invention.

Referring to FIG. 1, a semiconductor device according to an embodiment may include a charge controller 10, a delay unit 20, a control signal generator 30 and a discharger 40.

The charge controller 10 may control an amount of electric charges on a node ND10 according to a level of an input signal IN to output a drive signal DRV through the node ND10. The input signal IN may be set as a command signal that puts the semiconductor device in an active mode.

The delay unit 20 may include a capacitor C10 coupled between the node ND10 and a ground voltage VSS terminal and a buffer 21 coupled to the node ND10. The capacitor C10 may store the electric charges of the node ND10. The buffer 21 may generate a detection signal DET enabled when the amount of electric charges of the node ND10 is equal to a predetermined value and may retard the drive signal DRV by a predetermined delay time, which is set according to the amount of electric charges of the node ND10, to generate an output signal OUT.

More specifically, the buffer 21 of the delay unit 20 may include an inverter IV10 and an inverter IV11 which are serially connected to the node ND20. The inverter IV10 may drive the node ND10 to generate the detection signal DET enabled to have a logic "high" level when the amount of electric charges of the node ND10 is equal to a predetermined value, and the inverter IV11 may inversely buffer the detection signal DET to generate the output signal OUT. That is, the buffer 21 may generate the detection signal DET enabled when the amount of electric charges of the node ND10 is equal to a predetermined value and may retard the drive signal DRV by a predetermined delay time, which is set according to the amount of electric charges of the node ND10, to generate the output signal OUT. The predetermined amount of electric charges of the node ND10 may correspond to an electric charge amount that it is necessary for the inverter IV10 to generate the detection signal DET having a logic "high" level. Further, the delay time of the drive signal DRV may be controlled by a capacitance value of the capacitor C10.

The control signal generator 30 may receive the input signal IN to generate a control signal CON enabled when the amount of electric charges of the node ND10 is equal to the predetermined value. That is, the control signal generator 30 may generate the control signal CON which is enabled if the amount of electric charges of the node ND10 is equal to the predetermined value to generate the detection signal DET enabled.

The discharger 40 may be configured to include an NMOS transistor N10 that is coupled between the node ND10 and the ground voltage VSS terminal to discharge electric charges of the node ND10 into the ground voltage VSS terminal when the control signal CON is enabled.

A configuration of the charge controller 10 will be described more fully hereinafter with reference to FIG. 2.

Figure 2:
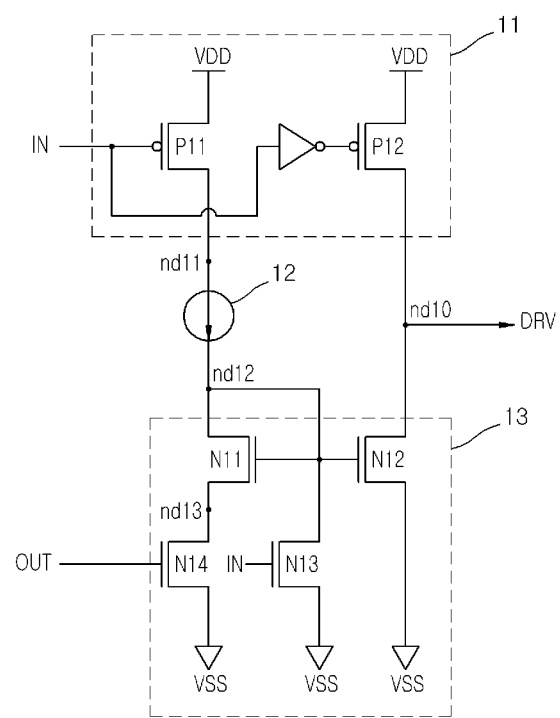
FIG. 2 is a circuit diagram illustrating a charge controller included in the semiconductor device of FIG. 1.

Referring to FIG. 2, the charge controller 10 may include a first charge controller 11, a current source 12 and a second charge controller 13.

The first charge controller 11 may include a PMOS transistor P12 that is turned on to supply electric charges from a power supply voltage VDD terminal to the node ND10 when the input signal IN having a logic "high" level is inputted thereto and a PMOS transistor P11 that is turned on to supply electric charges from a power supply voltage VDD terminal to a node ND11 when the input signal IN having a logic "low" level is inputted thereto. That is, the first charge controller 11 may supply electric charges from the power supply voltage VDD terminal to the node ND10 to generate the drive signal DRV having a logic "high" level when the input signal IN having a logic "high" level is inputted thereto and may supply electric charges from the power supply voltage VDD terminal to the node ND11 when the input signal IN having a logic "low" level is inputted thereto.

The current source 12 may be coupled between the node ND11 and a node ND12 and may receive electric charges from the node ND11 to supply a constant amount of electric charges to the node ND12. The amount of electric charges supplied from the current source 12 may be set to be different according to the embodiments.

The second charge controller 13 may be configured to include an NMOS transistor N11, an NMOS transistor N12, an NMOS transistor N13 and an NMOS transistor N14. The NMOS transistor N11 may be coupled between the node ND12 and a node ND13 and may be turned on according to the amount of electric charges of the node ND12 to discharge the electric charges of the node ND12 to the node ND13. The NMOS transistor N12 may be coupled between the node ND10 and the ground voltage VSS terminal and may be turned on according to the amount of electric charges of the node ND12 to discharge the electric charges of the node ND10. The NMOS transistor N13 may be coupled between the node ND12 and the ground voltage VSS terminal and may be turned on according to a level of the input signal IN to discharge the electric charges of the node ND12. The NMOS transistor N14 may be coupled between the node ND13 and the ground voltage VSS terminal and may be turned on according to a level of the output signal OUT to discharge the electric charges of the node ND13. That is, the second charge controller 13 may discharge electric charges of the node ND10 by the amount of electric charges discharged from the node ND12 when the input signal IN has a logic "low" level and the output signal OUT has a logic "high" level. Alternatively, the second charge controller 13 may discharge the electric charges of the nodes ND12 to the ground voltage VSS terminal when the input signal IN has a logic "high" level.

A configuration of the control signal generator 30 will be described more fully hereinafter with reference to FIG. 3.

Figure 3:
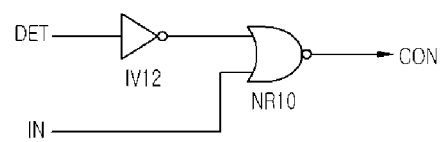
FIG. 3 is a logic circuit diagram illustrating a control signal generator included in the semiconductor device of FIG. 1.
Figure 4:
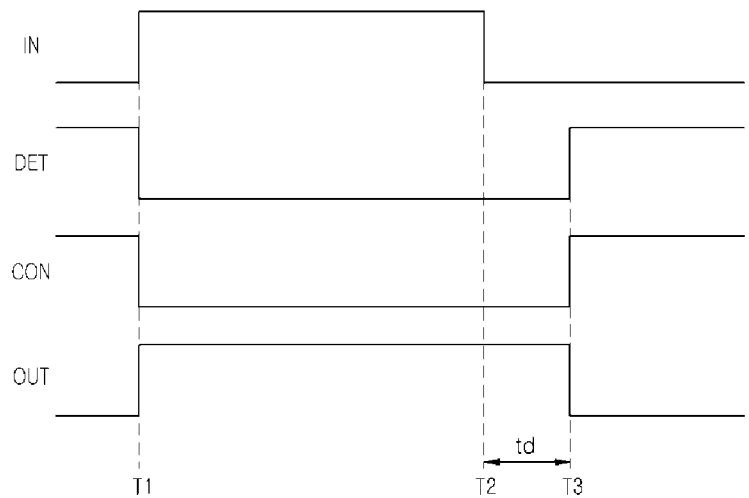
FIG. 4 is a timing diagram illustrating an operation of a semiconductor device according to an embodiment of the present invention.

Referring to FIG. 3, the control signal generator 30 may include an inverter IV12 that inversely buffers the detection signal DET and a NOR gate NR10 that executes a NOR operation of the input signal IN and an output signal of the inverter IV12 to generate the control signal CON. That is, the control signal generator 30 may generate the control signal CON having a logic "high" level if the input signal IN has a logic "low" level and the detection signal DET has a logic "high" level. The inverter IV12 may be designed such that a pull-down drivability of the inverter IV12 is greater than a pull-up drivability thereof.

An operation of the semiconductor device having the aforementioned configuration will be described hereinafter with reference to FIGS. 1 to 4 in conjunction with an example in which electric charges are supplied to the node ND10 according to a level of the input signal IN and the electric charges supplied to the node ND10 are discharged after a predetermined delay time Td to generate the output signal OUT.

At a point of time "T1", the first charge controller 11 of the charge controller 10 may supply electric charges from the power supply voltage VDD terminal to the node ND10 in response to the input signal IN having a logic "high" level to generate the drive signal DRV having a logic "high" level. In such a case, the second charge controller 13 does not discharge the electric charges of the node ND10 because no electric charges are supplied to the node ND12.

The capacitor C10 of the delay unit 20 may store the electric charges of the node ND10 therein.

The buffer 21 of the delay unit 20 may inversely buffer the drive signal DRV having a logic "high" level to generate the detection signal DET having a logic "low" level and may inversely buffer the detection signal DET to generate the output signal OUT having a logic "high" level.

The control signal generator 30 may generate the control signal CON having a logic "low" level in response to the input signal IN having a logic "high" level and the detection signal DET having a logic "low" level.

The discharger 40 may receive the control signal CON having a logic "low" level to retain the electric charges of the node ND10 without any discharge.

Next, at a point of time "T2", the first charge controller 11 of the charge controller 10 may receive the input signal IN having a logic "low" level to supply the electric charges from the power supply voltage VDD terminal to the node ND11. The current source 12 may receive the electric charges of the node ND11 to supply a constant amount of electric charges to the node ND12. The second charge controller 13 may receive the input signal IN having a logic "low" level to discharge electric charges of the node ND10 by the amount of electric charges discharged from the node ND12.

The buffer 21 of the delay unit 20 may inversely buffer the drive signal DRV having a logic "high" level to generate the detection signal DET having a logic "low" level and may inversely buffer the detection signal DET to generate the output signal OUT having a logic "high" level. This is because the amount of electric charges of the node ND10 is greater than a predetermined value.

The control signal generator 30 may generate the control signal CON having a logic "low" level in response to the input signal IN having a logic "low" level and the detection signal DET having a logic "low" level.

The discharger 40 may receive the control signal CON having a logic "low" level to retain the electric charges of the node ND10 without any discharge.

Next, at a point of time "T3", the first charge controller 11 of the charge controller 10 may receive the input signal IN having a logic "low" level to supply the electric charges from the power supply voltage VDD terminal to the node ND11. The current source 12 may receive the electric charges of the node ND11 to supply a constant amount of electric charges to the node ND12. The second charge controller 13 may receive the input signal IN having a logic "low" level to discharge electric charges of the node ND10 by the amount of electric charges discharged from the node ND12.

The buffer 21 of the delay unit 20 may generate the detection signal DET having a logic "high" level and may inversely buffer the detection signal DET to generate the output signal OUT having a logic "low" level. This may be because the electric charges of the node ND10 are discharged after the point of the time "T2" to reach a predetermined amount at the point of time "T3". That is, the delay unit 20 may generate the output signal OUT having a logic "low" level after a predetermined delay time Td elapses from the point of time "T2" that the input signal IN is generated to have a logic "low" level.

The control signal generator 30 may generate the control signal CON having a logic "high" level in response to the input signal IN having a logic "low" level and the detection signal DET having a logic "high" level.

The discharger 40 may receive the control signal CON having a logic "high" level to discharge the electric charges of the node ND10. That is, the discharger 40 may forcibly discharge the electric charges of the node ND10 when the amount of electric charges of the node ND10 is equal to a predetermined value.

Figure 5:
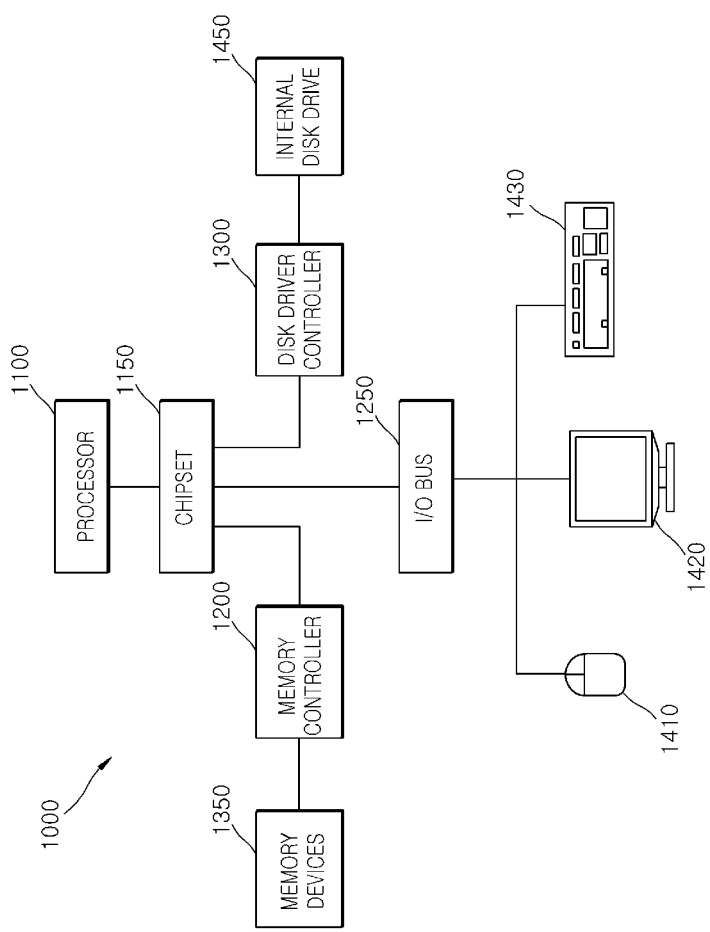
FIG. 5 illustrates a block diagram of a system employing a memory controller circuit in accordance with an embodiment of the present invention.

Referring to FIG. 5, a system 1000 may include one or more processors 1100. The processor 1100 may be used individually or in combination with other processors. A chipset 1150 may be operably coupled to the processor 1100. The chipset 1150 is a communication pathway for signals between the processor 1100 and other components of the system 1000, which may include a memory controller 1200, an input/output ("I/O") bus 1250, and a disk drive controller 1300. Depending on the configuration of the system 1000, any one of a number of different signals may be transmitted through the chipset 1150.

The memory controller 1200 may be operably coupled to the chipset 1150. The memory controller 1200 can receive a request provided from the processor 1100, through the chipset 1150. The memory controller 1200 may be operably coupled to one or more memory devices 1350. The memory devices 1350 may include the semiconductor device described above.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430.

The disk drive controller 1300 may also be operably coupled to the chipset 1150. The disk drive controller 1300 may serve as the communication pathway between the chipset 1150 and one or more internal disk drives 1450. The internal disk drive 1450 and disk drive controller 1300 may communicate with each other or with the chipset 1150 using virtually any type of communication protocol, including all of those mentioned above with regard to the I/O bus 1250.

As described above, the semiconductor device according to the embodiments may forcibly discharge electric charges of the node ND10 when the amount of electric charges of the node ND10 for generating the output signal OUT reaches a predetermined value by retarding the input signal IN by a predetermined delay time. Thus, even though a level of a power supply voltage VDD signal varies, a level transition of the output signal OUT may be prevented.

What is claimed is:

1. A semiconductor device comprising:
    a charge controller suitable for controlling an amount of electric charges on a first node in response to a level of an input signal to output a drive signal through the first node;
    a delay unit suitable for including a capacitor coupled to the first node and suitable for retarding the drive signal to generate an output signal, a delay time of the drive signal being controlled according to an amount of electric charges of the first node; and
    a discharger suitable for discharging the electric charges of the first node in response to a control signal enabled when the amount of electric charges of the first node is equal to a predetermined value,
    wherein the delay unit further includes a buffer that is suitable for inversely buffering the drive signal to generate a detection signal and suitable for inversely buffering the detection signal to generate the output signal.

2. The semiconductor device of claim 1, wherein an amount of electric charges stored in the capacitor coupled to the first node increases when the input signal has a first level and decreases when the input signal has a second level.

3. The semiconductor device of claim 1, wherein the delay time of the drive signal corresponds to a discharge time of the capacitor.

4. The semiconductor device of claim 1, wherein the charge controller includes:
    a first charge controller suitable for supplying electric charges from a power supply voltage terminal to the first node when the input signal IN has a first level and suitable for supplying electric charges from the power supply voltage terminal to a second node when the input signal IN has a second level;
    a current source suitable for supplying electric charges from the second node to a third node; and
    a second charge controller suitable for discharging electric charges of the first node by an amount of electric charges discharged from the third node when the input signal has the second level.

5. The semiconductor device of claim 1, wherein the detection signal is enabled when the amount of electric charges of the first node is equal to the predetermined value.

6. The semiconductor device of claim 1, further comprising a control signal generator suitable for receiving the input signal to generate a control signal enabled if the detection signal is enabled.

7. The semiconductor device of claim 6, wherein the control signal is enabled if the input signal has a second level and the detection signal is enabled.

8. The semiconductor device of claim 6, wherein the control signal is disabled if the input signal has a first level.

9. A semiconductor device comprising:
    a charge controller suitable for controlling an amount of electric charges on a first node in response to a level of an input signal to output a drive signal through the first node;

a delay unit suitable for including a capacitor coupled to the first node and suitable for retarding the drive signal to generate an output signal, a delay time of the drive signal being controlled according to an amount of electric charges of the first node;

a control signal generator suitable for generating a control signal enabled when the amount of electric charges of the first node is equal to a predetermined value; and a discharger suitable for discharging the electric charges of the first node in response to the control signal, wherein the delay unit further includes a buffer that is suitable for inversely buffering the drive signal to generate a detection signal and suitable for inversely buffering the detection signal to generate the output signal.

10. The semiconductor device of claim 9, wherein an amount of electric charges stored in the capacitor coupled to the first node increases when the input signal has a first level and decreases when the input signal has a second level.

11. The semiconductor device of claim 9, wherein the delay time of the drive signal corresponds to a discharge time of the capacitor.

12. The semiconductor device of claim 9, wherein the charge controller includes:

a first charge controller suitable for supplying electric charges from a power supply voltage terminal to the first node when the input signal IN has a first level and suitable for supplying electric charges from the power supply voltage terminal to a second node when the input signal IN has a second level;

a current source suitable for supplying electric charges from the second node to a third node; and a second charge controller suitable for discharging electric charges of the first node by an amount of electric charges discharged from the third node when the input signal has the second level.

13. The semiconductor device of claim 9, wherein the detection signal is enabled when the amount of electric charges of the first node is equal to the predetermined value.

14. The semiconductor device of claim 13, wherein the control signal is enabled if the input signal has a second level and the detection signal is enabled.

15. The semiconductor device of claim 13, wherein the control signal is disabled if the input signal has a first level.

16. The semiconductor device of claim 9, wherein the discharger is configured to discharge the electric charges of the first node when the amount of the electric charges of the first node is equal to the predetermined value.

17. The semiconductor device of claim 16, wherein the electric charges of the first node are discharged by retarding the input signal by a predetermined delay time.

18. The semiconductor device of claim 9, wherein the buffer generates the detection signal when the amount of the electric charges of the first node is equal to the predetermined value.

19. A system comprising:

a processor;

a controller configured to receive a request and a data from the processor; and a memory unit configured to receive the request and the data from the controller, wherein the memory unit includes:

a charge controller suitable for controlling an amount of electric charges on a first node to output a drive signal through the first node;

a delay unit suitable for including a capacitor coupled to the first node and suitable for retarding the drive signal to generate an output signal, a delay time of the drive signal being controlled according to an amount of electric charges of the first node; and a discharger suitable for discharging the electric charges of the first node when the amount of electric charges of the first node is equal to a predetermined value, wherein the delay unit further includes a buffer that is suitable for inversely buffering the drive signal to generate a detection signal and suitable for inversely buffering the detection signal to generate the output signal.

* * * * *